United States Patent
Tsujimoto et al.

(10) Patent No.: US 10,867,778 B2
(45) Date of Patent: Dec. 15, 2020

(54) CLEANING METHOD AND PROCESSING APPARATUS

(71) Applicant: Tokyo Electron Limited, Tokyo (JP)

(72) Inventors: Hiroshi Tsujimoto, Miyagi (JP); Toshikatsu Tobana, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/358,914

(22) Filed: Mar. 20, 2019

(65) Prior Publication Data
US 2019/0295825 A1   Sep. 26, 2019

(30) Foreign Application Priority Data

Mar. 23, 2018   (JP) ................ 2018-056964

(51) Int. Cl.
*H01J 37/32* (2006.01)
*H01L 21/67* (2006.01)

(52) U.S. Cl.
CPC .. *H01J 37/32862* (2013.01); *H01J 37/32449* (2013.01); *H01J 37/32834* (2013.01); *H01L 21/67069* (2013.01); *H01J 2237/334* (2013.01)

(58) Field of Classification Search
CPC combination set(s) only.
See application file for complete search history.

(56) References Cited

U.S. PATENT DOCUMENTS

2005/0189071 A1* 9/2005 Moriya ............ H01L 21/67248
                                              156/345.27
2007/0221493 A1* 9/2007 Honda ............ H01L 21/31144
                                              204/192.1

FOREIGN PATENT DOCUMENTS

JP        2005-243915        9/2005

* cited by examiner

*Primary Examiner* — Erin F Bergner
(74) *Attorney, Agent, or Firm* — IPUSA, PLLC

(57) ABSTRACT

A cleaning method for cleaning a processing apparatus including a processing container, a mounting stage configured to mount an object to be processed inside the processing container, an edge ring disposed at a peripheral edge portion of the mounting stage, a gas supply unit configured to supply a gas into an inside of the processing container, and a direct current power source configured to apply a direct voltage to the edge ring, and an exhaust unit configured to exhaust the inside of the processing container includes a first process of exhausting the gas inside the processing container by the exhaust unit while the gas is supplied into the inside of the processing container by the gas supply unit at least predetermined flow rate, and a second process of applying a predetermined direct voltage to the edge ring by the direct current power source.

9 Claims, 2 Drawing Sheets

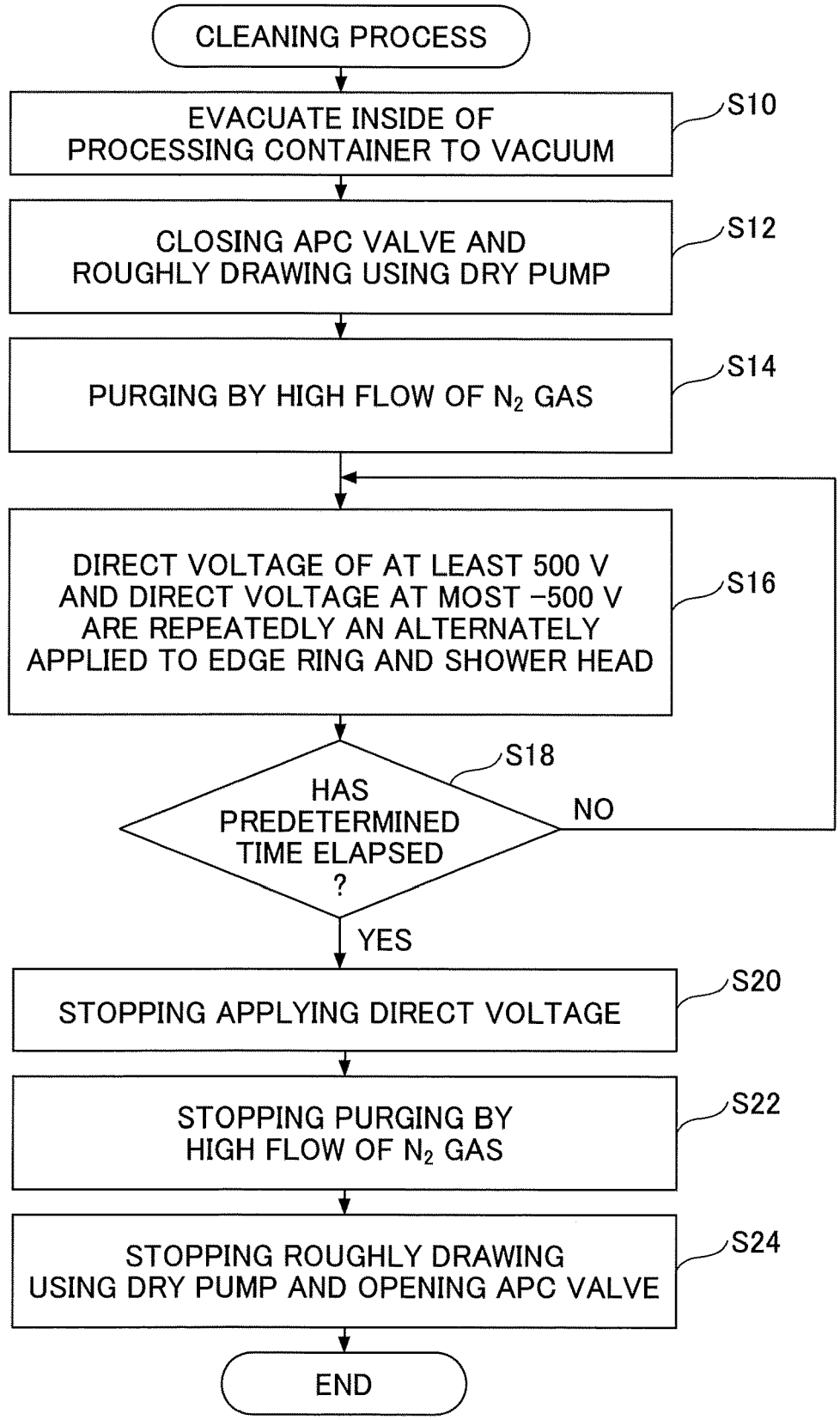

CLEANING METHOD AND PROCESSING APPARATUS

CROSS-REFERENCE TO RELATED APPLICATIONS

This patent application is based upon and claims the priority to Japanese Patent Application No. 2018-056964 filed on Mar. 23, 2018, the entire contents of which are incorporated herein by reference.

BACKGROUND OF THE INVENTION

1. Field of the Invention

The present invention relates to a cleaning method and a processing apparatus.

2. Description of the Related Art

The following technique is proposed in, for example, Patent Document 1. A gas having a high flow rate is supplied into the inside of a processing container to generate a shock wave due to a pressure increase. The generated shock wave causes a particle attached onto the inside of the processing container to be peeled off, and the peeled particle is exhausted using viscous force of the gas.
[Patent Document 1] Japanese Laid-open Patent Publication No. 2005-243915

SUMMARY OF THE INVENTION

However, a particle inside the processing contained may not be completely removed using the above technique. For example, there is a case where a particle is left at a peripheral portion of the edge ring, which is disposed at a peripheral edge portion of a semiconductor wafer (hereinafter, referred to as a "wafer") on a mounting stage. Then, the particle adsorbs on the outermost periphery of the wafer mounted on the mounting stage to influence the process of the wafer. Therefore, the yield of the wafer is dropped and the productivity is degraded. If the particle is generated in a part disposed inside the processing container at a position other than the periphery of the mounting stage, the process of the wafer is influenced.

One aspect of the present invention has an object of effectively removing the particle in order to solve the above problem.

To solve the problem, there is provided a cleaning method for cleaning a processing apparatus including a processing container, a mounting stage configured to mount an object to be processed inside the processing container, an edge ring disposed at a peripheral edge portion of the mounting stage, a gas supply unit configured to supply a gas into an inside of the processing container, and a direct current power source configured to apply a direct voltage to the edge ring, and an exhaust unit configured to exhaust the inside of the processing container includes a first process of exhausting the gas inside the processing container by the exhaust unit while the gas is supplied into the inside of the processing container by the gas supply unit at at least predetermined flow rate, and a second process of applying a predetermined direct voltage to the edge ring by the direct current power source.

BRIEF DESCRIPTION OF THE DRAWINGS

FIG. 2 is a flowchart illustrating an example of a cleaning process of the embodiment of the present invention.

DETAILED DESCRIPTION OF EMBODIMENTS

Figure 1:
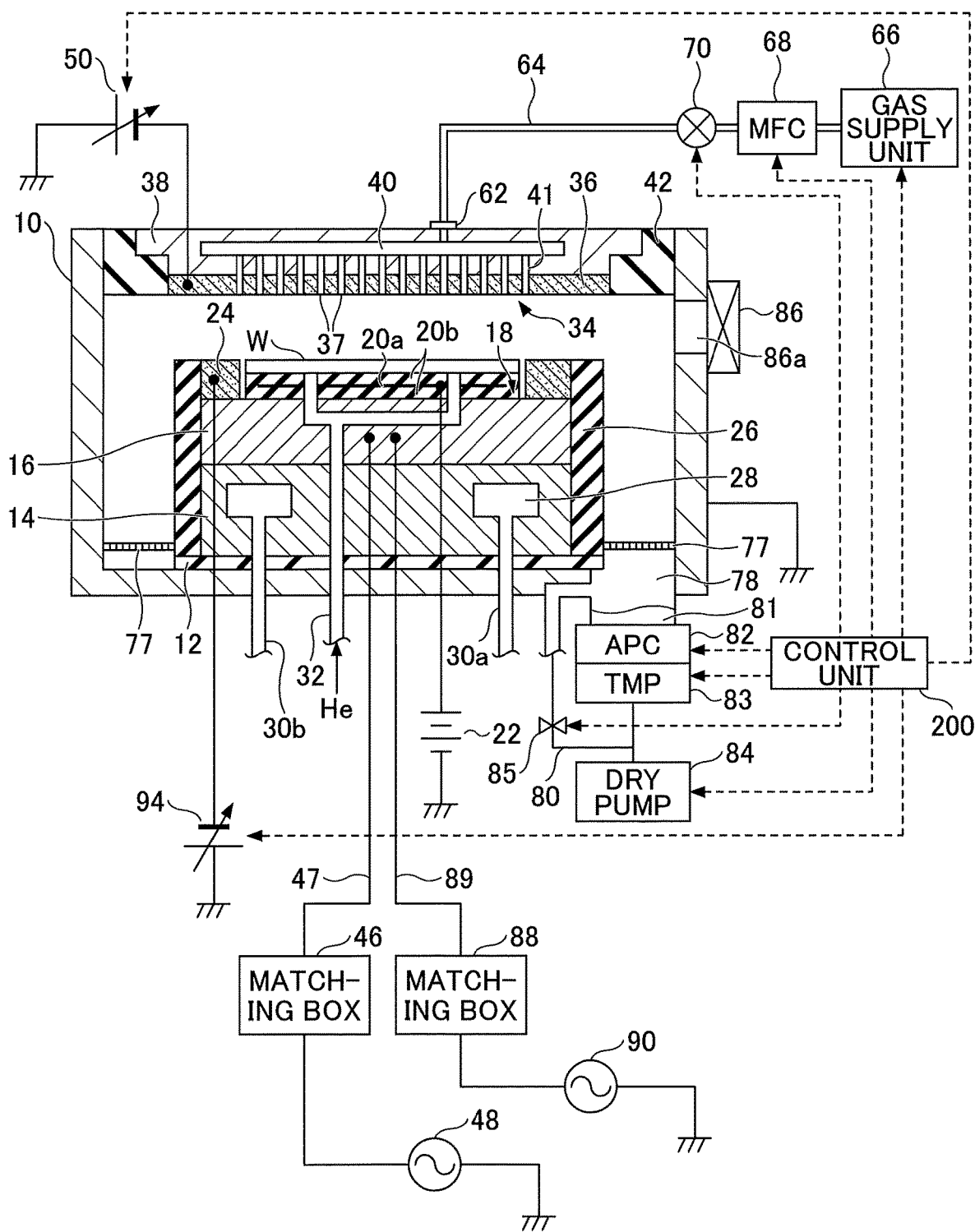
FIG. 1 illustrates an example of a processing apparatus according to an embodiment of the present invention.

A description of embodiments of the present invention is given below, with reference to FIGS. 1 and 2.

The embodiments described below are only examples and the present invention is not limited to the embodiments.

Through all figures illustrating the embodiments, the same references symbols are used for portions having the same function, and repetitive explanations of these portions are omitted.

Reference symbols typically designate as follows:
1: processing apparatus;
10: processing container;
16: mounting stage (lower electrode);
24: edge ring;
34: shower head (upper electrode);
48: first high frequency power source;
50: variable direct current power source;
66: gas supply unit;
80: exhaust unit;
82: APC valve;
83: TMP;
84: dry pump;
90: second high frequency power source;
94: variable direct current power source; and
200: control unit.

Hereinafter, an embodiment of the present invention is explained with reference to figures. Through the specification and the figures, the same references symbols are used for portions having substantially the same structure, and repetitive explanations of these portions are omitted.
[Overall Structure of Plasma Processing Apparatus]

At first, referring to FIG. 1, an example of a processing apparatus of an embodiment of the present invention is described. FIG. 1 illustrates the example of the processing apparatus according to the embodiment. Within this embodiment, a plasma processing apparatus is described as an example of the processing apparatus 1.

The plasma processing apparatus is of a capacitor-coupled parallel-plate type and has a cylindrical processing container 10 made of aluminum having a surface that is provided with an anodic oxidation process.
The processing container 10 is grounded.

A supporting stage 14 in a cylindrical column shape is disposed through the insulating plate 12 made of ceramics or the like. A mounting stage 16 made of aluminum is disposed on the supporting stage 14. A wafer W as an example of an object to be processed is mounted on the mounting stage 16.

An electrostatic chuck 18 for holding the wafer W by adsorbing the wafer W using electrostatic force is provided on the upper surface of the mounting stage 16. The electrostatic chuck 18 has a structure such that an electrode 20a made with a conductive film is sandwiched by a pair of insulating layers 20b or insulating sheets. A direct current power source 22 is connected to the electrode 20a. The wafer W is held by being adsorbed by the electrostatic force such as coulomb force generated by a direct voltage supplied from the direct current power source 22.

A conductive edge ring 24 made with, for example, silicon is disposed at the peripheral edge portion of the wafer W. An inner wall member 26 in a cylindrical shape made of, for example, quartz is disposed on the side surfaces of the mounting stage 16 and the supporting stage 14.

For example, a refrigerant chamber 28 in a ring-like shape is provided inside the supporting stage 14. A refrigerant such as cooling water having a predetermined temperature is supplied from a chiller unit provided outside through pipes 30a and 30b. With this, the temperature of the wafer W on the mounting stage 16 is controlled by the temperature of the refrigerant. Further, a heat transfer gas such as an He gas is supplied inbetween the upper surface of the electrostatic chuck 18 and the back surface of the wafer W through a gas supply line 32 from a heat-transfer gas supply mechanism.

The mounting stage 16 is connected to a first high frequency power source 48 through a feed rod 47 and a matching box 46. The first high frequency power source 48 applies high frequency power having a frequency of at least 13.56 MHz for generating plasma of, for example, 60 MHz to the mounting stage 16. The matching box 46 causes the load impedance on the side of plasma to match the internal (or output) impedance of the first high frequency power source 48. With this, the first matching box 46 functions such that the internal impedance of the first high frequency power source 48 seemingly matches the load impedance when plasma is generated inside the processing container 10. power source 90 applies high frequency power having a frequency of, for example, 400 kHz from among the frequency of 400 kHz to 13.56 MHz that is lower than the frequency of the high frequency power applied by the first high frequency power source 48 to the mounting stage 16. The matching box 88 matches the load impedance on the plasma side with an internal (output) impedance of the second high-frequency power source 90. With this, the matching box 88 functions such that the internal impedance of the second high-frequency power source 90 seemingly matches the load impedance when plasma is generated inside the processing container 10. With this, the mounting stage 16 functions also as a lower electrode. The mounting stage 16 may not include the electrostatic chuck 18.

Above the mounting stage 16, a shower head 34 as a facing member arranged at a position facing the mounting stage 16 is disposed. A processing space is formed between the shower head 34 and the mounting stage 16. The shower head 34 forms a facing face 4 facing the mounting stage 16 and also functions as the upper electrode.

The shower head 34 is supported by an upper portion of the processing container 10 through an insulative shielding member 42. The shower head 34 includes an electrode plate 36 having a large number of gas discharge ports and an electrode supporter 38 that attachably and detachably supporting the electrode plate 36 and an electrode supporter that has the surface made with aluminum provided with, for example, anodic oxidation. The electrode plate 36 is preferably made with silicon or SiC. A gas diffusion chamber 40 is formed inside the electrode supporter 38. A large number of gas communication holes 41 extend downward from the gas diffusion chamber 40 so as to communicate with the gas discharge port 37.

A gas introducing port 62 is formed in an electrode supporter 38 so as to guide a gas into the gas diffusion chamber 40. A gas supply pipe 64 is connected to the gas introducing port 62. A gas supply unit 66, a mass flow controller (MFC) 68, and an on-off valve 70 are sequentially arranged from the upstream side and are connected to the gas supply pipe 64. The gas is supplied from the gas supply unit 66. The flow rate and the supply timing are controlled by the mass flow controller 68 and the on-off valve 70. The gas passes through the gas supply pipe 64 and reaches the gas diffusion chamber 40. Then, the gas is introduced into the processing space like shower from the gas discharge port 37 through the gas communication holes 41.

A variable direct current power source 50 is connected to the shower head 34 such that the direct voltage from the variable direct current power source 50 is applied to the shower head 34. A variable direct current power source 94 is connected to the edge ring 24 such that the direct voltage from the variable direct current power source 94 is applied to the edge ring 24. The variable direct current power sources 50 and 94 may be a bipolar power source.

An exhaust port 78 is formed at a bottom portion of the processing container 10. An exhaust unit 80 is connected to the exhaust port 78 through an exhaust pipe 81. An exhaust plate 77 is disposed in an exhaust passage leading to the exhaust port 78. The exhaust plate 77 is provided to catch or reflect plasma generated in the processing space so as to prevent the plasma from leaking into the exhaust unit 80. The exhaust plate 77 may be formed to coat aluminum material with ceramics such as Y2O3.

The exhaust unit 80 includes an adaptive pressure control (APC) valve 82, a turbo molecular pump (TMP) 83, dry pump 84, and a valve 85.

The TMP 83 and the dry pump 84 are connected to the exhaust pipe 81 through the APC valve 82. The dry pump 84 depressurizes the inside of the processing container 10 from the atmospheric pressure to a medium vacuum state (for example, at most $1.3 \times 10$ Pa (0.1 Torr)) as a roughly draw. At that time, the valve 85 disposed in the pipe (bypass route) connecting the dry pump 84 to the exhaust port 78 is opened and the APC valve 82 is closed.

The TMP 83 collaborate with the dry pump 84 to depressurize the inside of the processing container 10 to a high vacuum state (for example, at most $1.3 \times 10^{-3}$ Pa ($1.0 \times 10^{-5}$ Torr)) lower than the middle vacuum state. At this time, the APC valve 82 is opened and the valve 85 is closed. With this, the inside of the processing container 10 can be depressurized to have a predetermined degree of vacuum.

A carry-in carry-out port 86a is formed on a sidewall of the processing container 10. The carry-in carry-out port 86a can be opened and closed by the gate valve 86. When a predetermined process such as etching is performed in the processing apparatus, the gate valve 86 is made in the opened state, the wafer W is carried into the processing container 10 through the carry-in carry-out port 86a and caused to be mounted on the mounting stage 16.

Then, an etching gas supplied from the gas supply unit 66 is supplied like shower at a predetermined flow rate to the gas diffusion chamber 40 through the gas communication holes 41 and the gas discharge port 37 into the inside of the processing container 10. Further, the inside of the processing container 10 is exhausted by the exhaust unit 80.

The high-frequency power for generating plasma is applied from the first high frequency power source 48 to the mounting stage 16 and the high-frequency power for drawing ions is applied from the second high frequency power source 90 to the mounting stage 16 while the etching gas is introduced into the processing container 10. Then, the direct voltage is applied from the direct current power source 22 to the electrode 20a so that the wafer W is adsorbed by the mounting stage 16. Further, the direct voltage is applied from the variable direct current power source 50 to the shower head 34, and the direct voltage is applied from the variable direct current power source 94 to the edge ring 24. The etching gas supplied into the processing container 10 is converted into plasma by energy of the high-frequency power for generating plasma, and the wafer W is etched by radicals and ions.

A control unit 200 is provided to control an overall operation of the processing apparatus 1. The control unit 200 includes a memory such as a read only memory (ROM) and a random access memory (RAM) and a CPU. The control unit 200 controls a predetermined process such as etching in accordance with a recipe stored in the memory. The recipe is set to include control information of the apparatus for process conditions such as a processing time, pressure (gas exhaust), the high-frequency power, the voltage, various gas flow rates, the temperature inside the processing container (the temperature of the upper electrode), the temperature of the sidewall of the processing container, the temperature of the wafer W, the temperature of the electrostatic chuck, and so on) and the temperature of the refrigerant output from the chiller. The recipe indicating the program and the processing conditions may be stored in a hard disk or a semiconductor memory. Further, the recipe may be stored in a recording medium readable by a portable computer such as a CD-ROM, a DVD, or the like.

The control unit 200 controls the cleaning process in accordance with a recipe for cleaning stored in the memory. The recipe for cleaning is set to include control information of the apparatus for process conditions for cleaning such as a cleaning time, the pressure (gas exhaust), the direct voltage, the gas flow rate, opening and closing of the APC valve and the valve 85. The control unit 200 switches the positive voltage and the negative voltage of the direct voltage supplied from the variable direct current power sources 50 and 94 in accordance with the recipe for cleaning.

[Cleaning Process]

Next, an example of the cleaning process performed by the processing apparatus 1 of the embodiment is described with reference to FIG. 2. FIG. 2 is a flowchart illustrating the example of the cleaning process of the embodiment of the present invention.

This cleaning process is performed at a time of maintaining the processing apparatus 1. Regarding an example of the timing when this cleaning process is performed, the example is immediately after starting a lot including the wafers as many as 25 pieces or during idling between lots. This cleaning process may be performed after processing a sheet or a predetermined number of sheets of wafers.

After this process is started, the control unit 200 exhausts the inside of the processing container 10 so as to be a predetermined pressure (evacuate to vacuum) (step S10). The predetermined pressure is at most $13 \times 10^{-2}$ Pa ($1.0 \times 10^{-3}$ Torr). Next, the control unit 200 closes the APC valve 82 and opens the valve 85 so as to exhaust (roughly draw) using the dry pump (step S12).

Next, the control unit 200 controls a $N_2$ gas to have a flow rate of at least 1000 sccm (hereinafter, the flow rate of at least 1000 sccm is called a high flow rate) and supplies the $N_2$ gas of the high flow rate from the gas supply unit 66 to the inside of the processing container 10 from the gas supply unit so as to purge the inside of the processing container 10 (Step S14).

Next, the control unit 200 repeatedly applies by switching the direct voltages that have the absolute values of at least 500 V and are mutually adverse between the positive and negative voltage values from the variable direct current power source 50 and 94 (step S16).

Next, the control unit 200 determines whether the predetermined time has been elapsed (step S18), performs the process of step S16 until the predetermined time elapses, and goes to step S20 after the predetermined time elapses.

Next, the control unit 200 stops applying the direct voltage from the variable direct current power sources 50 and 94 in step S20. Next, the control unit 200 stops purging inside the processing container 10 using the high flow of $N_2$ gas (step S22), and stops roughly drawing using the dry pump 84 and opens the APC valve 82 (step S24). Then, this process ends.

According to the cleaning process of the embodiment described above, the inside of the processing container 10 is evacuated to vacuum so that the pressure inside the processing container 10 becomes, for example, at most $13 \times 10^{-2}$ Pa ($1.0 \times 10^{-3}$ Torr). In this state, the inside of the processing container 10 is purged by the $N_2$ gas and is exhausted to be evacuated so that the shock wave is generated in the inside of the processing container 10 and the generated shock wave causes the particle inside the processing container to be peeled off.

Thereafter, by applying the direct voltages to the edge ring 24 and the shower head 34 to generate the electrostatic force, and the repulsive force (electromagnetic stress) caused by the electrostatic force makes the particles at the periphery of the edge ring 24 and the particles at the periphery of the shower head 34 suspend. The suspending particles are carried to the exhaust port 78 using viscous force of the $N_2$ gas of the high flow rate and are exhausted by the exhaust unit 80.

Steps S12 and S14 are an example of a first process, in which the gas inside the processing container 10 is exhausted by the exhaust unit 80 while the gas supply unit 66 supplies the gas into the inside of the processing container 10 at the predetermined flow rate. Further, step S16 is an example of the second process of applying a predetermined direct voltage to the edge ring 24 and the shower head 34 by the direct current power source.

As described above, in the cleaning process of the embodiment, in addition to the first process of causing the particles to be peeled off by the shock wave caused by an abrupt pressure increase inside the processing container 10, the second process of applying the predetermined direct voltages to the edge ring 24 and the shower head 34 is performed. With this, in comparison with the case where only the first process of causing the particles to be peeled off by the shock wave, it is possible to further effectively remove the particles at the edge portion of the wafer W, the shoulder portion of the electrostatic chuck 18, at the peripheral portion of the edge ring, and at the peripheral portion of the shower head 34.

Especially, within the embodiment, the two different direct voltages of the direct voltage being at least +500 V and the direct voltage being at most −500 V are switched over and alternately and repeatedly applied to the edge ring 24 and the shower head 34. With this, the particles which may be positively or negatively charged are caused to be securely peeled off by the repulsive force of the electrostatic force.

However, the direct voltage applied to the shower head 34 from the variable direct current power source 50 and the direct voltage applied to the edge ring 24 from the variable direct current power source 94 are not limited to repeatedly supplying voltages having the same absolute values and mutually different in terms of the positive and negative voltages. The control unit 200 may change the outputs from variable direct current power source 50 and 94 to different direct voltages and the different direct voltages may be respectively applied to the shower head 34 and the edge ring 24. Further, the control unit 200 may change the outputs from variable direct current power source 50 and 94 to predetermined direct voltages and the predetermined direct voltages may be respectively applied to the shower head 34 and the edge ring 24.

The inert gas used for purging in the first process may be a rare gas such as an Ar gas and/or an $N_2$ gas. Further, the gas used for purging in the first process may be preferably a gas having high viscous force, for example, an $SF_6$ gas having high viscous force. In the first process, it is preferable that one or two or more gases selected from a group including an inert gas, an $SF_6$ gas, a $CF_4$ gas, and an $O_2$ gas are supplied at a flow rate of at least 1000 sccm into the inside of the processing container 10. Further, the second process is preferably performed while performing the first process after starting the first process.

MODIFIED EXAMPLE OF PROCESSING APPARATUS

Heretofore, as illustrated in FIG. 1, the cleaning process performed by the processing apparatus 1 having the structure of including both the edge ring 24 and the shower head 34 is described. The processing apparatus 1 includes the processing container 10, the mounting stage 16 for mounting the wafer inside the processing container, the shower head 34 as the facing member facing the mounting stage 16, the edge ring 24 disposed at the peripheral edge portion of the mounting stage 16, the gas supply unit 66 for supplying the gas into the inside of the processing container 10, the variable direct current power sources 50 and 94 for applying the direct voltages to the edge ring 24 and the shower head 34, and the exhaust unit 80 for exhausting the inside of the processing container 10.

Modified Example 1

However, the structure of the processing apparatus 1 is not limited to this and may not include the shower head 34 and the variable direct current power source 50 in a manner similar to the processing apparatus of the modified example 1. Said differently, the processing apparatus 1 of the modified example 1 may be structured to include the processing container 10, the mounting stage 16, the edge ring 24 disposed at the peripheral edge portion of the mounting stage 16, the gas supply unit 66 for supplying the gas into the inside of the processing container 10, the variable direct current power source 94 for applying the direct voltage to the edge ring 24, and the exhaust unit 80 for exhausting the inside of the processing container 10.

In the cleaning process of this processing apparatus 1, a process of causing the particles to be peeled off by the shock wave caused by an abrupt pressure increase inside the processing container 10 and a process of applying direct voltages having the absolute value of at least 500 V by switching over between positive and negative voltages to the edge ring 24 are performed.

With this, it is possible to effectively remove particles at the edge portion of the wafer W, the shoulder portion of the electrostatic chuck 18, and at the peripheral portion of the edge ring. The process of applying the direct voltages having the absolute value of at least 500 V by switching over between positive and negative voltages to the edge ring 24 is an example of the second process of applying the predetermined direct voltage to the edge ring 24 by the direct current power source.

Modified Example 2

The processing apparatus of the modified example 2 does not have the edge ring 24 and the variable direct current power source 94. Said differently, the processing apparatus 2 of the modified example 2 may be structured to include the processing container 10, the mounting stage 16, the shower head 34 facing the mounting stage 16, the gas supply unit 66 for supplying the gas into the inside of the processing container 10, the variable direct current power source 50 for applying the direct voltage to the shower head 34, and the exhaust unit 80 for exhausting the inside of the processing container 10.

In the cleaning process of this processing apparatus 1, a process of causing the particles to be peeled off by the shock wave caused by an abrupt pressure increase inside the processing container 10 and a process of applying direct voltages having the absolute value of at least 500 V by switching over between positive and negative voltages to the edge ring 24 are performed.

With this, particles in the shower head 34 and its peripheral portions can be effectively removed. The process of applying the direct voltages having the absolute value of at least 500 V by switching over between positive and negative voltages to the shower head 34 is an example of the second process of applying the predetermined direct voltage to the shower head 34 by the direct current power source.

Although the cleaning method and the processing apparatus of the embodiments have been described, the cleaning method and the processing apparatus are not limited to the above embodiments. Various modifications and alternations are possible within the scope of the present invention. The features described in the above multiple embodiments may be combined so as not to contradict one another.

The plasma processing apparatus of the embodiments may be any type of Capacitively Coupled Plasma (CCP), Inductively Coupled Plasma (ICP), Radial Line Slot Antenna, Electron Cyclotron Resonance Plasma (ECR), and Helicon Wave Plasma (HWP). The plasma processing apparatus is not limited to the parallel-plate type plasma processing apparatus. Further, the plasma processing apparatus of the embodiments is not limited to the plasma processing apparatus, and may be a non-plasma processing apparatus performing thermal treatment.

Although there has been described the semiconductor wafer W as the example of the object to be processed. However, the object to be processed is not limited to this and may be various substrates used for a Liquid Crystal Display (LCD) and a Flat Panel Display (FPD), a Compact Disk (CD) substrate, a printed wiring board, and so on.

According to an aspect of the present invention, the particles can be effectively removed.

All examples and conditional language recited herein are intended for pedagogical purposes to aid the reader in understanding the invention embodiments and the concepts contributed by the inventor to furthering the art, and are to be construed as being without limitation to such specifically recited examples and conditions, nor does the organization of such examples in the specification relate to a showing of superiority or inferiority of the invention embodiments. Although the cleaning method of the present invention have been described in detail, it should be understood that the various changes, substitutions, and alterations could be made hereto without departing from the spirit and scope of the invention.

What is claimed is:

1. A cleaning method for cleaning a processing apparatus including
   a processing container,
   a mounting stage configured to mount an object to be processed inside the processing container, an edge ring disposed at a peripheral edge portion of the mounting stage,
a gas supply unit configured to supply a gas into an inside of the processing container, and
a direct current power source configured to apply direct voltage to the edge ring, and
an exhaust unit configured to exhaust the inside of the processing container, the cleaning method comprising:
a first process of exhausting the gas inside the processing container by the exhaust unit while the gas is supplied into the inside of the processing container by the gas supply unit at least predetermined flow rate; and
a second process of switching over and repeatedly applying predetermined direct voltages, which are mutually adverse between positive and negative voltage values, to the edge ring by the direct current power source.

2. The cleaning method according to claim 1,
wherein the processing apparatus further includes a facing member facing the mounting stage inside the processing container, and
another predetermined direct voltage is further applied to the facing member in the second process.

3. The cleaning method according to claim 1,
wherein, in the second process, the direct voltages are applied while the first process is performed.

4. The cleaning method according to claim 1,
wherein, in the first process, at least one type of a gas selected from among a group including an inert gas, an $SF_6$ gas, a $CF_4$ gas, and an $O_2$ gas is supplied into the inside of a flow rate of at least 1000 sccm.

5. The cleaning method according to claim 4,
wherein the inert gas is at least any one of a rare gas and an $N_2$ gas.

6. A cleaning method for cleaning a processing apparatus including
a processing container,
a mounting stage configured to mount an object to be processed inside the processing container,
a facing member disposed to face the mounting stage inside the processing container,
a gas supply unit configured to supply a gas into an inside of the processing container, and
a direct current power source configured to apply direct voltage to the facing member, and
an exhaust unit configured to exhaust the inside of the processing container, the cleaning method comprising:
a first process of exhausting the gas inside the processing container by the exhaust unit while the gas is supplied into the inside of the processing container by the gas supply unit at least predetermined flow rate; and
a second process of switching over and repeatedly applying predetermined direct voltages, which are mutually adverse between positive and negative voltage values, to the facing member by the direct current power source.

7. The cleaning method according to claim 6,
wherein, in the second process, the direct voltages are applied while the first process is performed.

8. The cleaning method according to claim 6,
wherein, in the first process, at least one type of a gas selected from among a group including an inert gas, an $SF_6$ gas, a $CF_4$ gas, and an $O_2$ gas is supplied into the inside of a flow rate of at least 1000 sccm.

9. The cleaning method according to claim 8,
wherein the inert gas is at least any one of a rare gas and an $N_2$ gas.

\* \* \* \* \*